(12) United States Patent
Endoh et al.

(10) Patent No.: US 7,601,957 B2
(45) Date of Patent: Oct. 13, 2009

(54) ELECTRON MICROSCOPE AND COMBINED ILLUMINATION LENS

(75) Inventors: Hisamitsu Endoh, Kusatsu (JP); Masato Achihara, Suita (JP); Katsushige Tsuno, Akisima (JP); Tetsuo Oikawa, Tokyo (JP)

(73) Assignee: National University Corporation Kyoto Institute of Technology, Kyoto (JP)

( * ) Notice: Subject to any disclaimer, the term of this patent is extended or adjusted under 35 U.S.C. 154(b) by 116 days.

(21) Appl. No.: 11/884,765

(22) PCT Filed: Feb. 17, 2006

(86) PCT No.: PCT/JP2006/302884

§ 371 (c)(1),
(2), (4) Date: Jan. 16, 2008

(87) PCT Pub. No.: WO2006/088159

PCT Pub. Date: Aug. 24, 2006

(65) Prior Publication Data

US 2008/0149833 A1 Jun. 26, 2008

(30) Foreign Application Priority Data

Feb. 21, 2005 (JP) ............................. 2005-044190

(51) Int. Cl.
*G01N 23/00* (2006.01)
*G21K 7/00* (2006.01)

(52) U.S. Cl. ................. 250/311; 250/310; 250/306; 250/307; 250/442.11; 250/396 ML; 359/9; 359/29; 359/32; 359/1; 359/2; 359/3; 359/7; 359/15; 356/489; 356/457; 356/484

(58) Field of Classification Search .......... 250/310, 250/311, 306, 307, 442.11, 396 ML; 359/9, 359/29, 32, 1, 2, 3, 7, 15; 356/489, 457, 356/484
See application file for complete search history.

(56) References Cited

U.S. PATENT DOCUMENTS 4,935,625 A 6/1990 Hasegawa et al.
5,811,806 A 9/1998 Honda et al.

FOREIGN PATENT DOCUMENTS

JP 54-122970 9/1979

(Continued)

OTHER PUBLICATIONS

Yasuda, H., et al., "Evaluation of the Multi-column-cell (MCC)—PoC (proof of concept) system", Application to Charged Particle Beam Industry No. 132 Committee, No. 161 Study Meeting Material, Japan Society for the Promotion of Science, pp. 125-128, (2003).

(Continued)

*Primary Examiner*—Jack I Berman
*Assistant Examiner*—Meenakshi S Sahu
(74) *Attorney, Agent, or Firm*—The Nath Law Group; Jerald L. Meyer; Derek Richmond

(57) ABSTRACT

An object of the present invention is to provide an electron microscope that employs a hologram of a diffraction pattern to reconstruct a microscopic image involving no imaging aberration due to image forming lenses, as well as a combined illumination lens used for such an electron microscope. The electron microscope according to the present invention has an electron source (11), a condenser lens (12), a biprism (13) to split an electron beam supplied from the condenser lens (12) into coherent first and second electron beams (L1, L2) that are parallel to each other, a combined illumination lens (15) to make the first electron beam (L1) into a parallel wave and the second electron beam (L2) into a converging wave that converges at a predetermined distance, a sample stage (16) to hold a sample illuminated with the first electron beam (L1), a detector (17) to detect a hologram of a diffraction pattern formed by interference of the first electron beam (L1) with the second electron beam (L2), a computing unit (18) to conduct a predetermined Fourier transform on the hologram supplied from the detector (17) and reconstruct a microscopic image of the sample, and a display (19) to display the reconstructed microscopic image.

23 Claims, 6 Drawing Sheets

FOREIGN PATENT DOCUMENTS

| | | |
|---|---|---|
| JP | 64-065762 | 3/1989 |
| JP | 90-80199 | 3/1997 |
| JP | 2004-296908 | 10/2004 |

OTHER PUBLICATIONS

Haraguchi, T., et al., "Multicolumn cell: Evaluation of the proof of concept system", *J. Vac. Sci. Tecnol. B,* vol. 22, No. 3, pp. 985-988, (2004).

FIG. 6
(a)
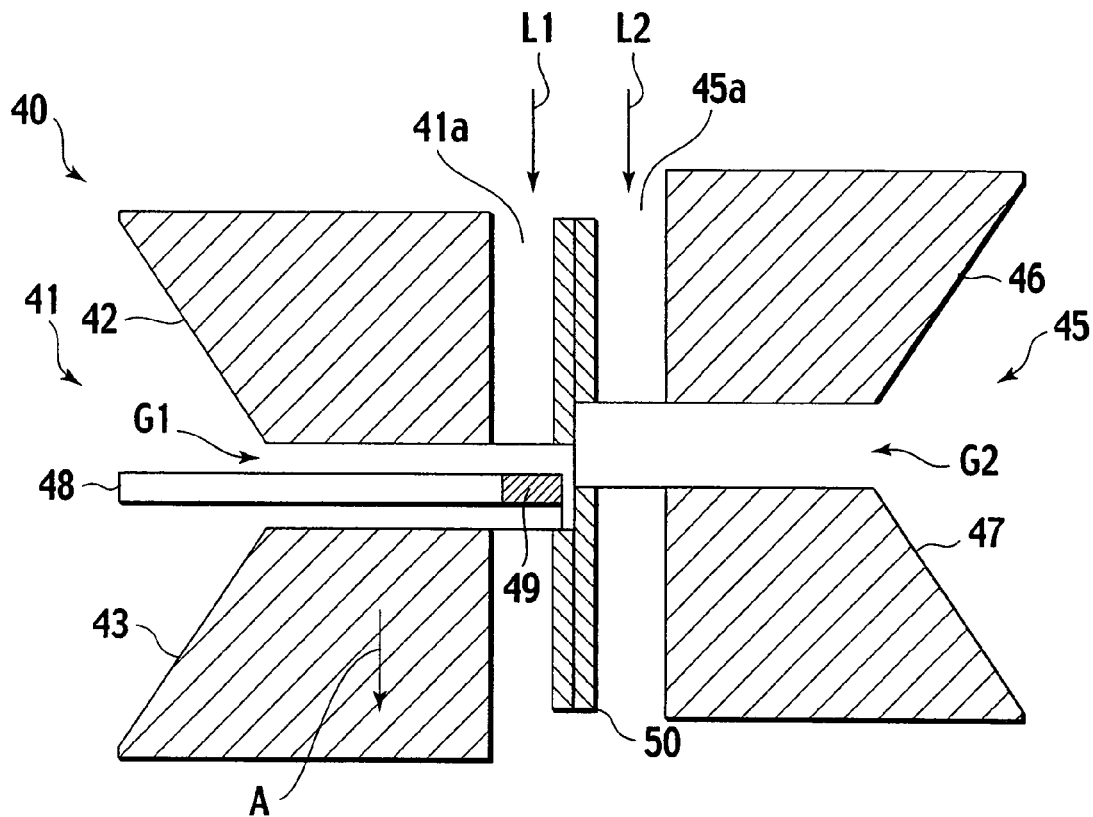
(b)
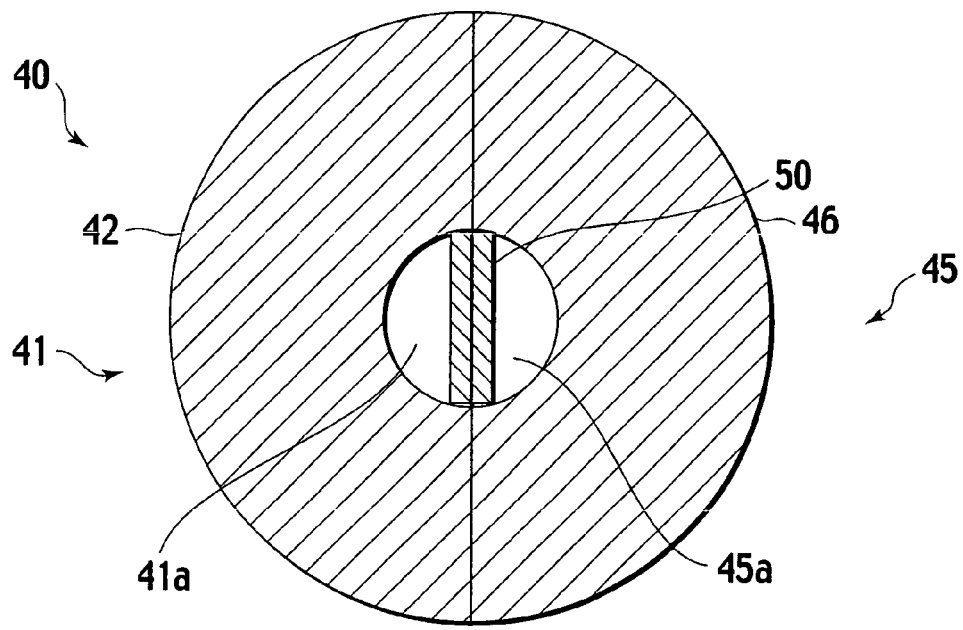

ELECTRON MICROSCOPE AND COMBINED ILLUMINATION LENS

TECHNICAL FIELD

The present invention relates to an electron microscope for reconstructing a microscopic image from a hologram of a diffraction pattern of a sample and a combined illumination lens used for such an electron microscope.

BACKGROUND ART

FIG. 1 is a view schematically showing optical paths to form a microscopic image in an electron microscope according to a related art.

An electron source 101 supplies an electron beam, which is passed through a condenser lens 102 to illuminate a sample 103. After irradiating the sample 103, the electron beam is passed through an objective lens 104 to form a first microscopic image 111, and then, is passed through an intermediate lens 105 to form a second microscopic image 112. Finally, the electron beam is passed through a projection lens 106 to form a third microscopic image 113. According to the electron microscope of the related art, the objective lens 104, intermediate lens 105, and projection lens 106 that are typically called image forming lenses cause relatively large imaging aberrations.

FIG. 2 is a model showing image formation by an electron lens in an electron microscope according to a related art and corresponding mathematical processes.

An electron source (not shown) emits an electron beam through a condenser lens (not shown) to a sample 121. The electron beam is passed through the electron lens 122 to form a diffraction pattern 123 on a rear focal plane, and thereafter, a microscopic image 124 on an image plane. The sample 121 corresponds to the sample 103 of FIG. 1, the electron lens 122 to the objective lens 104 of FIG. 1, and the microscopic image 124 to the third microscopic image 113 of FIG. 1.

An optical system of this type corresponds to a series of mathematical processes shown in an upper part of FIG. 2. Namely, a Fourier transform is carried out for a phase change occurring at a bottom face of the sample 121, to provide a phase change spectrum of the sample 121. With respect to the phase change spectrum, a contrast transfer function of the electron lens 122 is computed to provide an image contrast spectrum corresponding to the diffraction pattern 123 on the rear focal plane. To the image contrast spectrum 123, a Fourier transform is carried out to provide an image contrast corresponding to the microscopic image 124.

When the diffraction pattern 123 is observed with a detector, an intensity distribution may be detectable but a phase is undetectable. Accordingly, the detected diffraction pattern loses phase information. There are problems, therefore, that the intensity distribution and phase information both necessary for reconstructing a microscopic image are not together obtainable and that the diffraction pattern observed with the detector is insufficient to provide a microscopic image through a Fourier transform.

To cope with the problems, a method was proposed to detect phase information from a hologram of a diffraction pattern. To create a hologram, it is necessary to make a diffracted wave transmitted through a sample interfere with a reference wave that is a spherical wave not transmitted through the sample. To form such diffracted wave and reference wave, Japanese Unexamined Patent Application Publication No. Hei-9-80199, for example, discloses an electron beam biprism. A biprism of this type is used for a conventional holography microscope that, overlays a parallel plane wave serving as a reference wave over a diffraction pattern of a sample, and the biprism is arranged after the sample and an objective lens.

On the other hand, in the field of electron beam lithography, studies are being made to improve throughputs of multibeam multicolumn drawing apparatuses. The "multicolumn" means electron beam columns formed at intervals of several millimeters. To provide such electron beam columns, there has been proposed a so-called lotus lens having a plurality of openings formed in a magnetic material in parallel with one another. Operation of this lens has experimentally been confirmed (for example, Hiroshi Yasuda, et al., MCC-PoC (proof of concept) system evaluation, Application to Charged Particle Beam Industry No. 132 Committee, No. 161 Study Meeting Material, Japan Society for the Promotion of Science, pp. 125-128, 2003 and T. Haraguchi, T. Sakazaki, T. Satoh, M. Nakano, S. Hamaguchi, T. Kiuchi, H. Yabara, and H. Yasuda, J. Vac. Sci. Technol. B22, 2004, Multicolumn Cell Evaluation of the proof of concept system).

It is required to realize an electron microscope that detects phase information from a hologram as mentioned above, and according to the phase information and an intensity distribution without using image forming lenses, provides a microscopic image having no imaging aberration due to the image forming lenses.

To form a diffracted beam and a reference beam that are coherent to each other in such an electron microscope, a biprism for splitting an incident electron beam must be arranged in front of a sample. A combined illumination lens arranged between the biprism and the sample must form a parallel wave serving as a diffracted beam from one of the split electron beams and a spherical wave serving as a reference beam from the other of the split electron beams.

The split electron beams from the biprism are distanced from each other only by several millimeters to maintain coherency. Due to this, it has been impossible to make a combined illumination lens capable of conducting separate actions of generating a parallel wave and a spherical wave within such a short distance.

DISCLOSURE OF THE INVENTION

In consideration of these problems, an object of the present invention is to provide an electron microscope employing a hologram of a diffraction pattern, for reconstructing a microscopic image involving no imaging aberrations due to image forming lenses, as well as a combined illumination lens used for such an electron microscope.

In order to solve these problems, the present invention provides an electron microscope including an electron source generating an electron beam, a condenser lens converging the electron beam supplied from the electron source at a predetermined distance, an electron beam split means splitting the electron beam supplied from the condenser lens into first and second electron beams, a combined illumination lens providing separately the first and second electron beams with lens actions, a sample hold means holding a sample so that the sample is illuminated with the first electron beam affected by the lens action of the combined illumination lens, a detection means detecting a Fourier transform electron beam hologram formed by interference of the first electron beam illuminated the sample with the second electron beam not illuminated the sample, a computing means conducting a predetermined operation on the electron beam hologram supplied from the detection means, and a display means displaying information of the sample supplied from the computing means.

The electron source generates a coherent electron beam. The electron beam split means splits the electron beam supplied from the condenser lens into coherent first and second electron beams. The combined illumination lens makes the first electron beam into a parallel wave and the second electron beam into a converging wave that converges at a point adjacent to the sample on a sample plane orthogonal to an optical axis. These waves are made interfere with each other to form the Fourier transform electron beam hologram. The computing means carries out a predetermined operation on the electron beam hologram supplied from the detection means, to reconstruct a microscopic image of the sample.

A projection lens for enlarging the hologram detected by the detection means is arranged after the combined illumination lens and sample hold means and before the detection means.

The computing means carries out a Fourier transform on the hologram, to reconstruct a microscopic image of the sample.

The combined illumination lens includes at least one first opening arranged along the first electron beam for transmitting the first electron beam, the first opening makes the transmitted first electron beam into a parallel wave, and at least one second opening arranged along the second electron beam for transmitting the second electron beam, the second opening makes the transmitted second electron beam into a converging wave.

The combined illumination lens includes a first magnetic member provided with at least one first opening transmitting the first electron beam and at least one second opening transmitting the second electron beam, a second magnetic member arranged after the first magnetic member, and having an opening transmitting the first electron beam transmitted through the first opening, at least one third magnetic member arranged after the first magnetic member and having an opening transmitting the second electron beam transmitted through the second opening, and a fourth magnetic member arranged after the second and third members and having at least one first opening transmitting the first electron beam and at least one second opening transmitting the second electron beam.

The second magnetic member is arranged along the first electron beam around the sample from the upstream side of the sample toward the downstream side thereof. The third magnetic member is arranged along the second electron beam downstream from the sample.

The first and second magnetic members are arranged so that a gap is present between these members along the first electron beam.

The first and second magnetic members have a distance S1 between them along the first electron beam, the second and fourth magnetic members have a distance S2 between them along the first electron beam, and the first and third magnetic members have a distance S3 between them along the second electron beam, so that the distances may satisfy a relational expression of $S1+S2=S3$.

The first and fourth magnetic members have the second openings in plural numbers, the third magnetic member is arranged for each of the second openings that transmit the second electron beam, and the distance between the first magnetic member and each third magnetic member along the second electron beam is S3.

The diameter of the opening of the second magnetic member along the first electron beam decreases toward the downstream side.

The electron microscope includes a first magnetic member having a first opening transmitting the first electron beam and a second magnetic member having a second opening transmitting the second electron beam. The first and second magnetic members have the same configuration. The first and second magnetic members are displaced from each other by a predetermined distance along the first and second electron beams.

The combined illumination lens is provided with a partition member between the first and second electron beams, to prevent these electron beams from intersecting each other.

An astigmatism correction means for correcting astigmatism produced by the combined illumination lens is arranged before and after the combined illumination lens.

The combined illumination lens according to the present invention is a combined illumination lens to which first and second electron beams that are parallel to each other and are separated by a predetermined distance are made incident. The combined illumination lens includes a first magnetic member provided with at least one first opening transmitting the first electron beam and at least one second opening transmitting the second electron beam, a second magnetic member arranged after the first magnetic member and having an opening transmitting the first electron beam transmitted through the first opening, at least one third magnetic member arranged after the first magnetic member and having an opening transmitting the second electron beam transmitted through the second opening, and a fourth magnetic member arranged after the second and third members and having at least one first opening transmitting the first electron beam and at least one second opening transmitting the second electron beam, to make the first electron beam into a parallel wave and the second electron beam into a converging wave.

The combined illumination lens according to the present invention is a combined illumination lens to which first and second electron beams that are parallel to each other and are separated by a predetermined distance are made incident. The combined illumination lens includes a first magnetic member provided with a first opening transmitting the first electron beam and a second magnetic member provided with a second opening transmitting the second electron beam. The first and second magnetic members have the same configuration. The first and second magnetic members are displaced from each other by a predetermined distance along the first and second electron beams, to make the first electron beam into a parallel wave and the second electron beam into a converging wave.

A partition member is arranged between the first and second electron beams, to prevent these electron beams from intersecting each other.

An astigmatism correction means for correcting astigmatism produced by the combined illumination lens is arranged before and after the combined illumination lens.

According to the present invention, a hologram of a diffraction pattern is used and image forming lenses are not used. As a result, there is provided an electron microscope that can reconstruct a microscopic image involving no imaging aberration due to image forming lenses. Also provided is a combined illumination lens used for such an electron microscope.

BRIEF DESCRIPTION OF THE DRAWINGS

FIG. 6 is a view showing a second concrete example of a combined illumination lens.

BEST MODE FOR CARRYING OUT THE INVENTION

Fourier transform holography electron microscopes employing combined illumination lenses according to embodiments of the present invention will be explained in detail with reference to the drawings.

Figure 1:
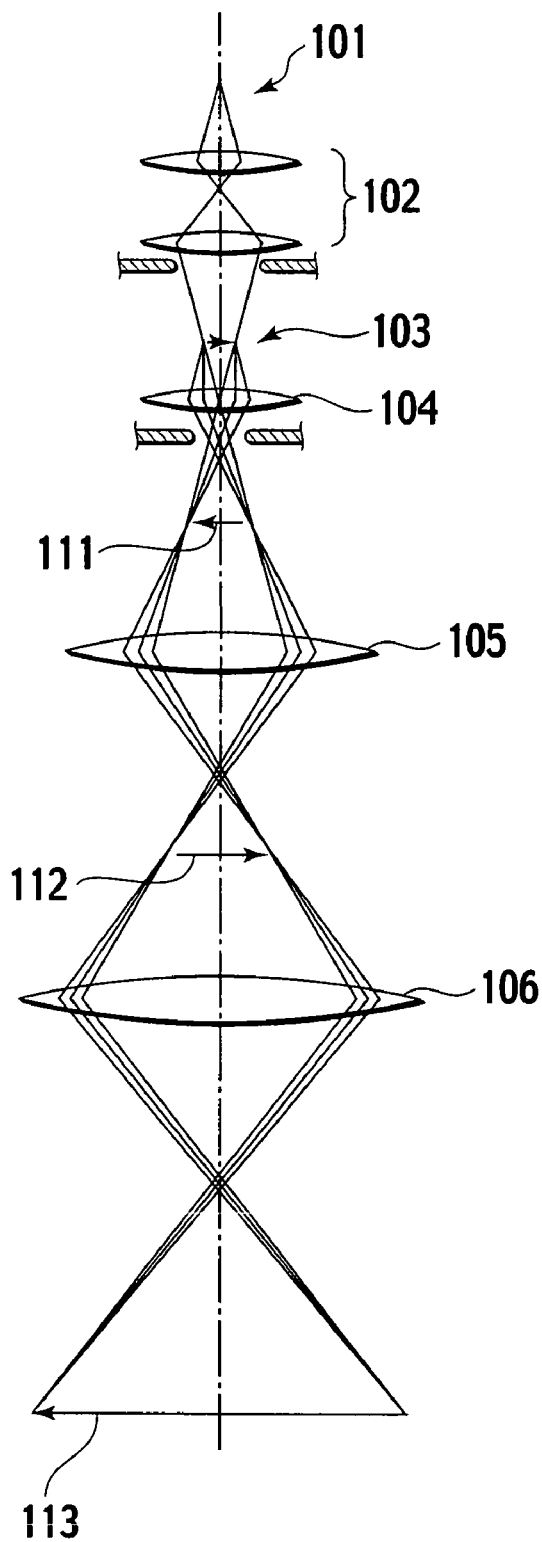
FIG. 1 is a view schematically showing optical paths to form a microscopic image in an electron microscope according to a related art.
Figure 2:
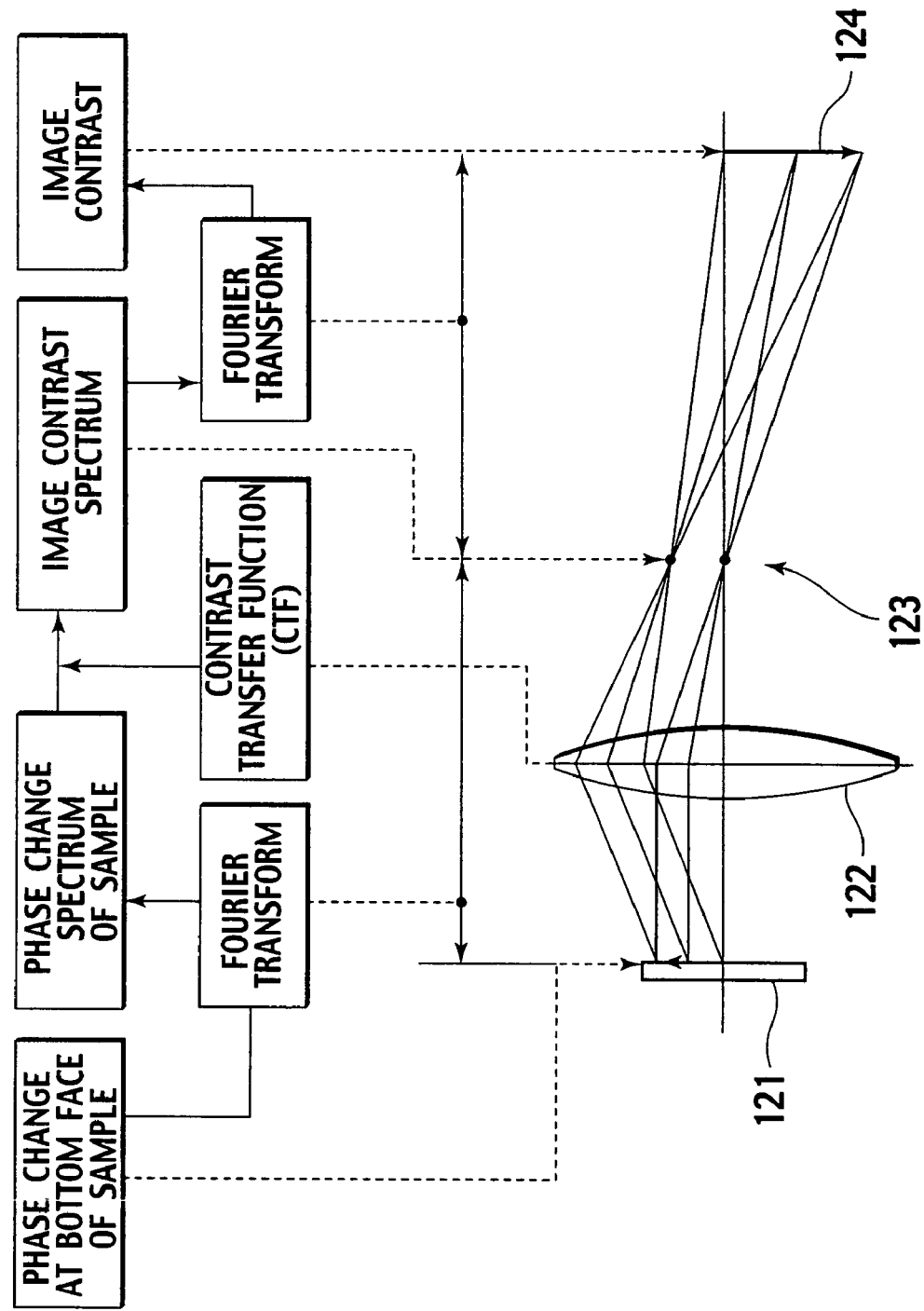
FIG. 2 is a model showing image formation by an electron lens in an electron microscope according to a related art and corresponding mathematical processes.
Figure 3:
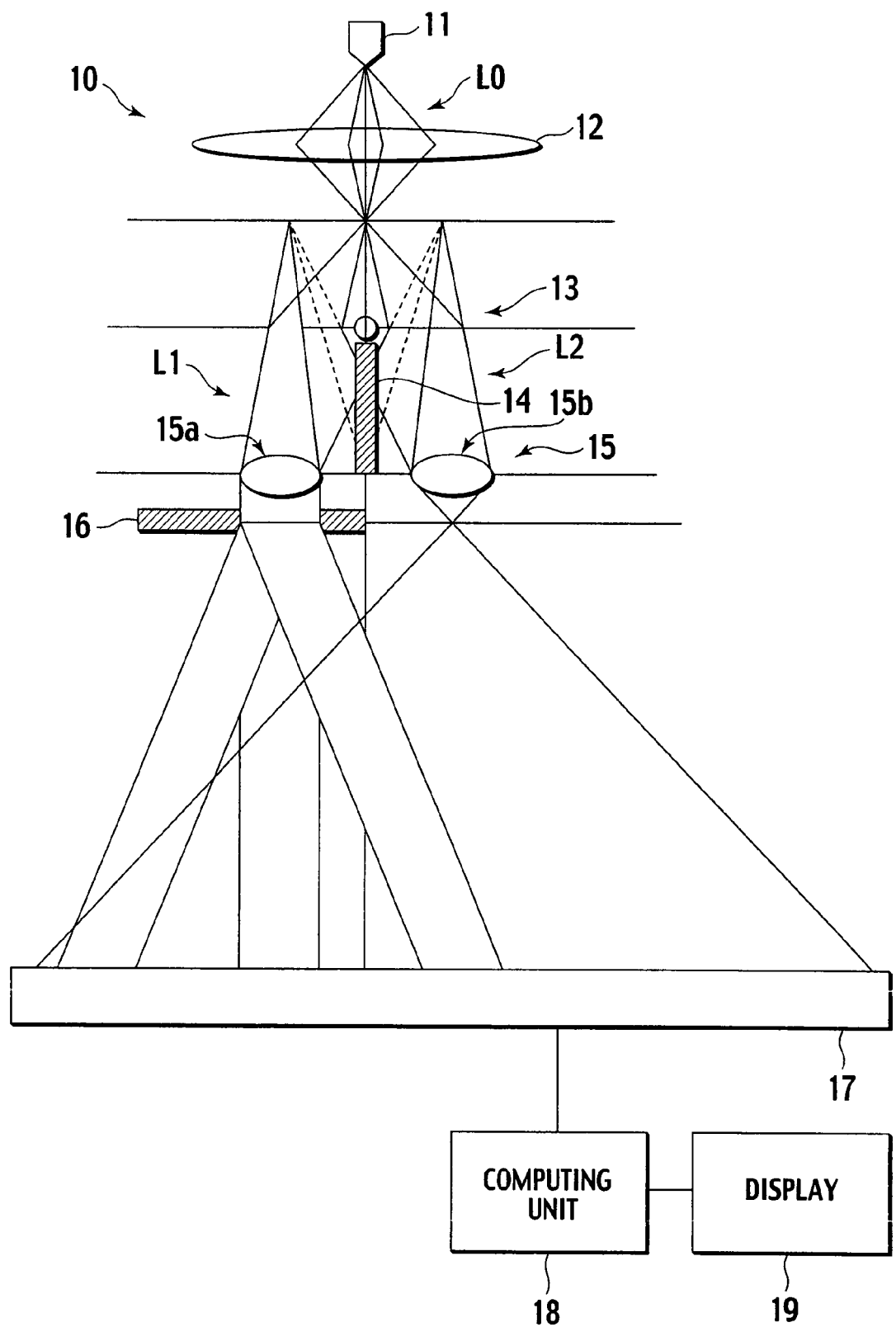
FIG. 3 is a model schematically showing the structure of an electron microscope according to the present invention.

FIG. 3 is a model schematically showing a structure of the Fourier transform holography electron microscope.

The Fourier transform holography electron microscope creates a diffracted beam transmitted through a sample and a reference beam not transmitted through the sample, makes the beams interfere with each other downstream from the sample, detects a hologram of a diffraction pattern, carries out a Fourier transform on the hologram, and reconstructs a microscopic image of the sample.

As shown in FIG. 3, the Fourier transform holography electron microscope 10 has an electron source 11 to generate an electron beam L0 and a condenser lens 12 to condense the electron beam L0 supplied from the electron source 11.

The electron source 11 is an electron gun to generate the predetermined electron beam L0 and is preferably a field emission electron gun. The condenser lens 12 converges the electron beam L0 supplied from the electron source 11 at a predetermined distance from the condenser lens 12 along the electron beam L0 and is composed of at least one lens.

The Fourier transform holography electron microscope 10 also has a biprism 13 serving as an electron beam split means to split the electron beam L0 supplied from the condenser lens 12 into coherent parallel first and second electron beams L1 and L2, as well as a shielding plate 14 serving as a partition (partition member) to prevent the first and second electron beams L1 and L2 supplied from the biprism 13 from intersecting each other.

The biprism 13 splits the electron beam L0 supplied from the condenser lens 12 into the first and second electron beams L1 and L2 that are spaced from each other by, for example, about several millimeters.

To prevent the first and second electron beams L1 and L2 split by the biprism 13 from intersecting each other, the shielding plate 14 is arranged between the first and second electron beams L1 and L2 after the biprism 13 and before a combined illumination lens 15 to be explained later. The shielding plate 14 is made of a magnetic material having a high magnetic permeability to efficiently shield the first and second electron beams L1 and L2.

The Fourier transform holography electron microscope 10 further has the combined illumination lens 15 that is arranged after the shielding plate 14, to make the first electron beam L1 into a parallel wave and the second electron beam L2 into a converging wave that converges at a predetermined distance, as well as a sample stage 16 serving as a sample hold means to hold a sample in the first electron beam L1 that is a parallel wave made by the combined illumination lens 15.

The combined illumination lens 15 has a first opening 15a to transmit the first electron beam L1 supplied from the biprism 13 and make the first electron beam L1 transmitted through the first opening 15a into a parallel wave. The first electron beam L1 as a parallel wave illuminates the sample held on the sample stage 16 in the first electron beam L1.

The combined illumination lens 15 also has a second opening 15b to transmit the second electron beam L2 supplied from the biprism 13. The second electron beam L2 transmitted through the second opening 15b becomes a converging wave that converges to a diameter of about several nanometers at a position substantially equal to a height position of the sample placed in the first electron beam L1.

The first and second openings 15a and 15b of the combined illumination lens 15 are spaced from each other by, for example, about several millimeters to match with the first and second electron beams L1 and L2 that are spaced from each other by, for example, about several millimeters. Concrete configurations of the combined illumination lens 15 will be explained later.

An enlargement lens may be inserted on the upstream side of a detector 17, to enlarge a hologram to be detected. This can increase an effective camera length, to improve the resolution of a hologram to be detected and recorded.

The Fourier transform holography electron microscope 10 has the detector 17 serving as a detection means to detect a hologram of a diffraction pattern, i.e., the intensity distribution of an interference image formed by an interference of the first electron beam L1 illuminated the sample with the second electron beam L2. The microscope 10 also has a computing unit 18 serving as a computing means to conduct Fourier transforms on the hologram detected by the detector 17 and reconstruct a microscopic image of the sample and a display 19 serving as a display means to display the microscopic image of the sample supplied from the computing unit 18.

The detector 17 has a detection plane substantially orthogonal to the first and second electron beams L1 and L2 and detects a spatial distribution of a hologram of a diffraction pattern on the detection plane. The detector 17 may employ, for example, a CCD. To enlarge a hologram to be detected by the detector 17, a projection lens may be arranged in front of the detector.

The computing unit 18 carries out Fourier transforms on the hologram-overlapped diffraction pattern detected by the detector 17 and converts a microscopic image in a reciprocal space into that in a real space. The diffraction pattern has intensity information, i.e., a spatial distribution of diffraction points, as well as phase information based on the hologram. Namely, it has both the intensity information and phase information. With the use of these information pieces, the computing unit 18 can reconstruct a microscopic image of the sample. The computing unit 18 may be a personal computer.

The display 19 displays the microscopic image provided by the computing unit 18 and is, for example, a CRT display or an LCD display.

Figure 4:
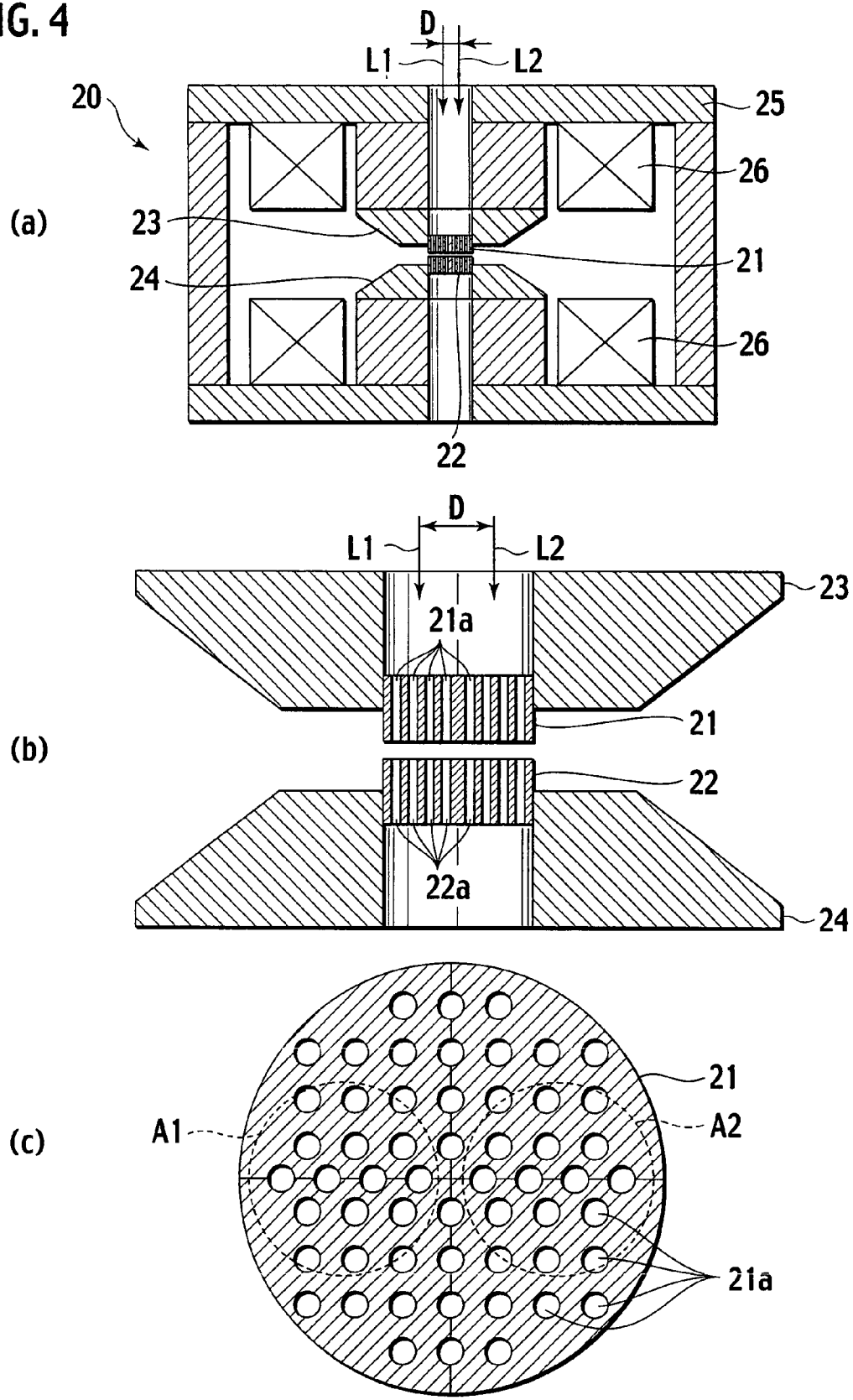
FIG. 4 is a view showing a first concrete example of a combined illumination lens.

FIG. 4 is a view showing a first concrete example of the combined illumination lens.

The combined illumination lens 20 of the first concrete example is a so-called lotus lens serving as the combined illumination lens 15 of FIG. 3.

As shown in a sectional view of FIG. 4(a), the combined illumination lens 20 has a first magnetic member 21 arranged along the first and second electron beams L1 and L2 that are spaced away from each other by a gap D of, for example, about several millimeters. The first magnetic member 21 has at least two openings to transmit the electron beams L1 and L2. The combined illumination lens 20 also has a second magnetic member 22 arranged along the first and second electron beams L1 and L2 downstream from the first magnetic member 21 to face the first magnetic member 21. The second magnetic member 22 has at least two openings to transmit the electron beams L1 and L2.

The first and second magnetic members 21 and 22 are attached to front ends of first and second pole pieces 23 and 24 that supply magnetic flux to the first and second magnetic members 21 and 22, respectively. The first and second pole pieces 23 and 24 are connected to a yoke 25 to form a magnetic circuit. The yoke 25 contains coils 26.

FIG. 4(b) is a sectional view showing the first and second magnetic members 21 and 22 of the combined illumination lens 20. The openings 21a formed in the first magnetic member 21 and the openings 22a formed in the second magnetic member 22 transmit the first and second electron beams L1 and L2. The openings 21a and 22a form multicolumn structures each serving as an independent lens of the same lens action. According to the embodiment, the multicolumn is properly combined with magnetic members so that the openings 21a and 22a may provide different lens actions depending on positions where the first and second electron beams L1 and L2 are transmitted.

FIG. 4(c) is a top view showing the first magnetic member 21 seen from the upstream sides of the first and second electron beams L1 and L2. The first magnetic member 21 has the openings 21a of a predetermined diameter substantially at constant intervals. The arrangement of the openings 21a shown in the figure is four-fold rotational symmetry with respect to the first and second electron beams L1 and L2. Symmetrically arranging the openings 21a results in uniformly distributing magnetic fields of the first and second magnetic members 21 and 22. In the figure, areas A1 and A2 roughly indicate the incident ranges of the first and second electron beams L1 and L2.

In connection with this sort of a lotus lens, it is experimentally known that, even if the openings 21a (22a) are not on the center axis of the lens, each opening serves as an electron lens around the center axis of the opening. Namely, the lotus lens operates on a single excitation current with a plurality of openings, i.e., lenses sharing a yoke and a coil.

In FIG. 4, the first and second magnetic members have the openings 21a and 22a. These openings show only the presence of openings in principle and are not required to be located as depicted. According to the embodiment, the first and second magnetic members 21 and 22 may each have at least two openings (21a, 22a).

Figure 5:
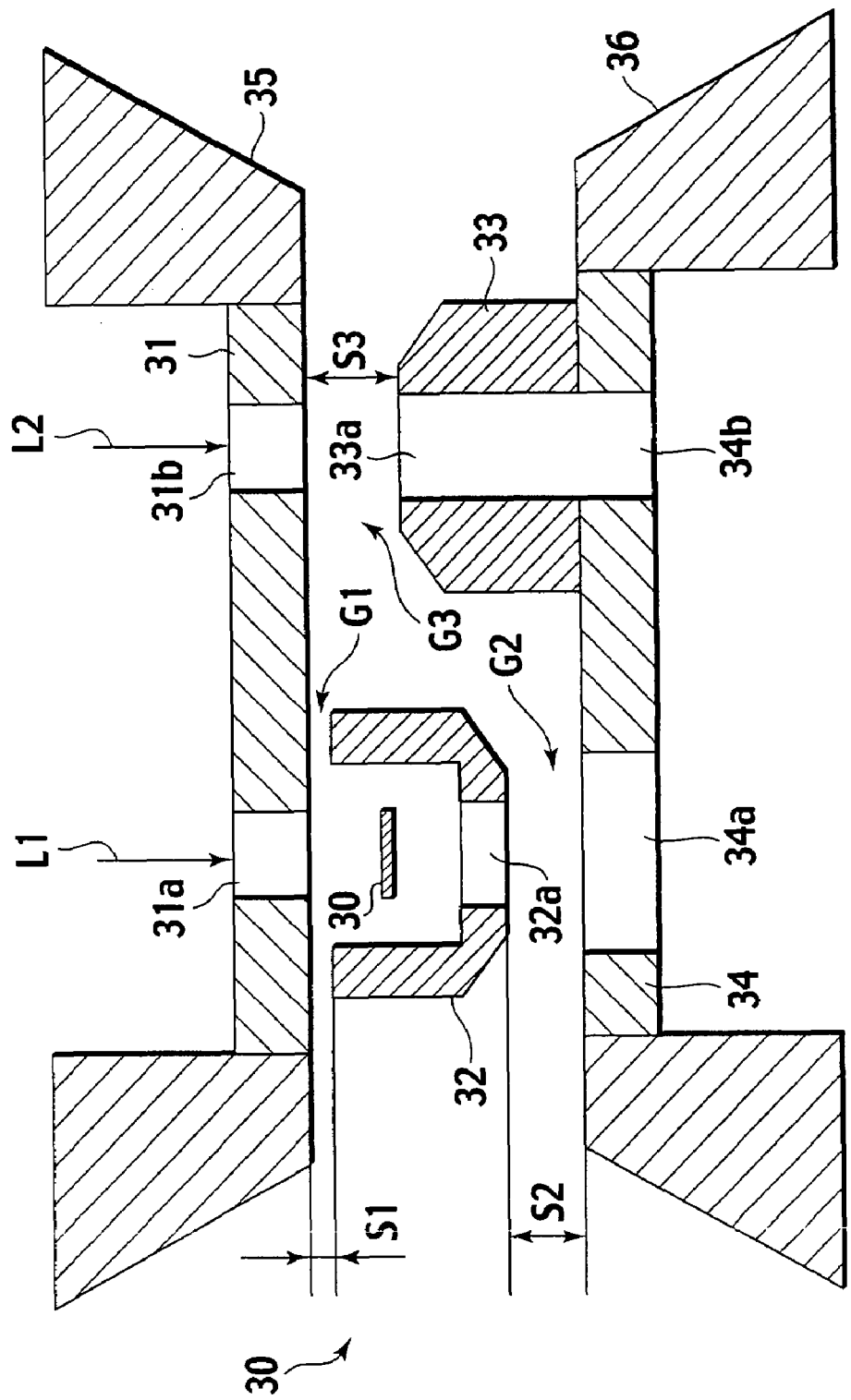
FIG. 5 is a view showing the details of the first concrete example of a combined illumination lens.

FIG. 5 is a sectional view showing the details of essential parts of the first concrete example of the combined illumination lens. Namely, FIG. 5 shows the details of the peripheral structures of the first and second magnetic members 21 and 22 shown in the sectional view of FIG. 4(b).

The combined illumination lens 30 corresponds to the combined illumination lens 20 shown in FIG. 4. A first magnetic member 31 has first and second openings 31a and 31b to transmit the first and second electron beams L1 and L2, respectively. A second magnetic member 32 is arranged after the first magnetic member 31, to face the first magnetic member 31 through a first gap G1 of a distance S1. The second magnetic member 32 is arranged in the first electron beam L1 and has an opening 32a to transmit the first electron beam L1. The first and second magnetic members 31 and 32 correspond to the first magnetic member 21 shown in FIG. 4.

In the second magnetic member 32, a sample stage (not shown) holds a sample 30 in the first electron beam L1. The second magnetic member 32 surrounds the sample 30 in the first electron beam L1 from the upstream side of the sample 30 to the downstream side thereof, to magnetically shield the sample 30.

A third magnetic member 33 is arranged after the first magnetic member 31, to face the first magnetic member 31 through a third gap G3 of a distance S3. The third magnetic member 33 is arranged in the second electron beam L2 and has an opening 33a to transmit the second electron beam L2. A fourth magnetic member 34 is arranged after the second and third magnetic members 32 and 33, to face the second magnetic member 32 through a second gap G2 of a distance S2. The fourth magnetic member 34 is in contact with the third magnetic member 33 without a gap and has first and second openings 34a and 34b to transmit the first and second electron beams L1 and L2, respectively. The third and fourth magnetic members 33 and 34 correspond to the second magnetic member 22 shown in FIG. 4.

The combined illumination lens 30 has the small first gap G1 upstream from the second member 32 and the large second gap G2 downstream from the second member 32, so that the first electron beam L1 entering the second member 32 may receive a weak magnetic field from the second gap G2. The first electron beam L1 made incident to the second member 32 is a diverging wave due to the condenser lens 12 shown in FIG. 3 and is made into a parallel wave due to the weak magnetic field.

The third gap G3 formed upstream from the third member 33 provides a strong magnetic field for the second electron beam L2 entering the third member 33, so that the second electron beam L2 may converge at a height position substantially equal to the height position of the sample 30.

The combined illumination lens 30 is arranged upstream from the sample 30, and therefore, does not generate an image forming magnetic field as an objective lens. Namely, a hologram of a diffraction pattern is formed at infinity. In principle, it will be sufficient to arrange the second gap G2 between the second member 32 and the fourth member 34. However, in the first and fourth members 31 and 34, there is an interaction between magnetic fields applied to the lenses along the first and second electron beams L1 and L2. Due to this, the first gap G1 is arranged between the first and second magnetic members 31 and 32 to reduce the strength of a magnetic field in the third gap G3 and uniformly apply a magnetic field to each lens. The distances S1, S2, and S3 of the first to third gaps G1, G2, and G3 are set to satisfy a relational expression of S1+S2=S3 to equalize magnetic fields applied to the lenses.

In FIG. 5, along the first electron beam L1, the first magnetic member 31 has one first opening 31a, the second magnetic member 32 has one opening 32a, and the fourth magnetic member 34 has one first opening 34a, to generate a diffraction beam from the sample 30. This is to obtain a diffraction beam from the first electron beam L1 illuminating the sample 30 held in the single second magnetic member 32.

On the other hand, to generate a reference beam, the first magnetic member 31 may have a plurality of the second openings 31b, the third magnetic member 33 may have a plurality of the openings 33a, and the fourth magnetic member 34 may have a plurality of the second openings 34b along the second electron beam L2 over an area (the area A2 of FIG. 4(c)) into which the second electron beam L2 is made incident. The openings 31b, 33a, and 34b and the magnetic member 33 cooperate to effectively act as a single lens that makes the second electron beam L2 into a converging wave of about several nanometers in diameter.

FIG. 6 is a view showing a second concrete example of the combined illumination lens. FIG. 6(a) is a sectional view showing the combined illumination lens and FIG. 6(b) is a top view showing the same.

The combined illumination lens 40 corresponds to the combined illumination lens 15 shown in FIG. 3 and has a first magnetic member 42 having an opening 41a to transmit the first electron beam L1 and a second magnetic member 43 having a first opening 41a to transmit the first electron beam L1. The second magnetic member 43 is arranged after the first magnetic member 42 along the first electron beam L1 and faces the first magnetic member 42 through a first gap G1. The first and second magnetic members 42 and 43 form a first side part 41 of the combined illumination lens 40 along the first and second electron beams L1 and L2.

The combined illumination lens 40 also has a third magnetic member 46 having a second opening 45a to transmit the second electron beam L2 and a fourth magnetic member 47 having a second opening 45a to transmit the second electron beam L2. The fourth magnetic member 47 is arranged after the third magnetic member 46 along the second electron beam L2 and faces the third magnetic member 46 through a second gap G2. The third and fourth magnetic members 46 and 47 form a second side part 45 of the combined illumination lens 40 along the first and second electron beams L1 and L2. The distance of the second gap G2 is equal to the distance of the first gap G1.

The combined illumination lens 40 also has a shielding plate 50 serving as a partition wall between the first opening 41a of the first side part 41 and the second opening 45a of the second side part 45, to prevent the first and second electron beams L1 and L2 from intersecting each other. The combined illumination lens 40 also has a sample stage 49 arranged in the first gap G1 of the first and second magnetic members 42 and 43 of the first side part 41, to support a sample 48 in the first electron beam L1 transmitted thought the first opening 41a.

In the combined illumination lens 40, the first and second side parts 41 and 45 have the same configuration and gaps, and as indicated with an arrow A, the first side part 41 is shifted relative to the second side part 45 toward the downstream side by a predetermined distance.

According to the combined illumination lens 40 with the above-mentioned configuration, the first gap G1 of the first side part 41 is downstream from the second gap G2 of the second side part 45, and therefore, the first and second side parts 41 and 45 may provide different actions by magnetic fields in the gaps G1 and G2. Namely, the first gap G1 of the first side part 41 provides a weak magnetic field to make the first electron beam L1 into a parallel wave and the second gap G2 of the second side part 45 provides a strong magnetic field to make the second electron beam L2 into a converging wave. The shielding plate 50 serves as a partition wall to prevent the magnetic fields of the first and second side parts 41 and 45 from mixing with each other.

The combined illumination lens 40 is two-fold rotational symmetry with respect to the first and second electron beams L1 and L2, to cause astigmatism due to a breakage of axial symmetry. Such astigmatism can be reduced by arranging a quadrupole lens before and after the combined illumination lens 40.

The invention claimed is:

1. An electron microscope comprising:
   an electron source generating an electron beam;
   a condenser lens converging the electron beam supplied from the electron source at a predetermined distance;
   an electron beam split means splitting the electron beam supplied from the condenser lens into first and second electron beams;
   a combined illumination lens providing separately the first and second electron beams with lens actions;
   a sample hold means holding a sample so that the sample is illuminated with the first electron beam affected by the lens action of the combined illumination lens;
   a detection means detecting a Fourier transform electron beam hologram formed by interference of the first electron beam illuminating the sample with the second electron beam not illuminating the sample;
   a computing means conducting a predetermined operation on the electron beam hologram supplied from the detection means; and
   a display means displaying information of the sample supplied from the computing means.

2. The electron microscope as set forth in claim 1, wherein:
   the electron source generates a coherent electron beam;
   the electron beam split means splits the electron beam supplied from the condenser lens into coherent first and second electron beams;
   the combined illumination lens makes the first electron beam into a parallel wave and the second electron beam into a converging wave that converges at a point adjacent to the sample on a sample plane orthogonal to an optical axis, these waves being made interfere with each other to form the Fourier transform electron beam hologram; and
   the computing means carries out a predetermined operation on the electron beam hologram supplied from the detection means to reconstruct a microscopic image of the sample.

3. The electron microscope as set forth in claim 1, further comprising:
   a projection lens enlarging the hologram detected by the detection means, the projection lens is arranged after the combined illumination lens and sample hold means and before the detection means.

4. The electron microscope as set forth in claim 1, wherein:
   the computing means carries out a Fourier transform on the hologram to reconstruct a microscopic image of the sample.

5. The electron microscope as set forth in claim 1, wherein the combined illumination lens comprises:
   at least one first opening arranged along the first electron beam for transmitting the first electron beam, the first opening makes the transmitted first electron beam into a parallel wave; and
   at least one second opening arranged along the second electron beam for transmitting the second electron beam, the second opening makes the transmitted second electron beam into a converging wave.

6. The electron microscope as set forth in claim 5, wherein the combined illumination lens has:
   a first magnetic member provided with at least one first opening transmitting the first electron beam and at least one second opening transmitting the second electron beam;
   a second magnetic member arranged after the first magnetic member and having an opening transmitting the first electron beam transmitted through the first opening;
   at least one third magnetic member arranged after the first magnetic member and having an opening transmitting the second electron beam transmitted through the second opening; and
   a fourth magnetic member arranged after the second and third members and having at least one first opening transmitting the first electron beam and at least one second opening transmitting the second electron beam.

7. The electron microscope as set forth in claim 6, wherein:
   the second magnetic member is arranged along the first electron beam around the sample from the upstream side of the sample toward the downstream side thereof and the third magnetic member is arranged along the second electron beam downstream from the sample.

8. The electron microscope as set forth in claim 7, wherein:
the first and second magnetic members are arranged so that a gap is present between these members along the first electron beam.

9. The electron microscope as set forth in claim 7, wherein:
the first and second magnetic members have a distance S1 between them along the first electron beam, the second and fourth magnetic members have a distance S2 between them along the first electron beam, and the first and third magnetic members have a distance S3 between them along the second electron beam, so that the distances may satisfy a relational expression of S1+S2=S3.

10. The electron microscope as set forth in claim 9, wherein:
the first and fourth magnetic members have the second openings in plural numbers, the third magnetic member is arranged for each of the second openings that transmit the second electron beam, and the distance between the first magnetic member and each third magnetic member along the second electron beam is S3.

11. The electron microscope as set forth in claim 7, wherein:
the diameter of the opening of the second magnetic member along the first electron beam decreases toward the downstream side.

12. The electron microscope as set forth in claim 5, further comprising:
a first magnetic member having a first opening transmitting the first electron beam; and
a second magnetic member having a second opening transmitting the second electron beam,
the first and second magnetic members having the same configuration and being displaced from each other by a predetermined distance along the first and second electron beams.

13. The electron microscope as set forth in claim 12, wherein:
the combined illumination lens is provided with a partition member between the first and second electron beams to prevent these electron beams from intersecting each other.

14. The electron microscope as set forth in claim 12, further comprising:
an astigmatism correction means correcting astigmatism produced by the combined illumination lens, the astigmatism correction means is arranged before and after the combined illumination lens.

15. A combined illumination lens receiving first and second electron beams that are parallel to each other and are separated by a predetermined distance, comprising:
a first magnetic member provided with at least one first opening transmitting the first electron beam and at least one second opening transmitting the second electron beam;
a second magnetic member arranged after the first magnetic member and having an opening transmitting the first electron beam transmitted through the first opening;
at least one third magnetic member arranged after the first magnetic member and having an opening transmitting the second electron beam transmitted through the second opening; and
a fourth magnetic member arranged after the second and third members and having at least one first opening transmitting the first electron beam and at least one second opening transmitting the second electron beam,
the combined illumination lens making the first electron beam into a parallel wave and the second electron beam into a converging wave.

16. The combined illumination lens as set forth in claim 15, wherein:
the second magnetic member is arranged along the first electron beam around a sample from the upstream side of the sample toward the downstream side thereof and the third magnetic member is arranged along the second electron beam downstream from the sample.

17. The combined illumination lens as set forth in claim 16, wherein:
the first and second magnetic members are arranged so that a gap is present between these members along the first electron beam.

18. The combined illumination lens as set forth in claim 15, wherein:
the first and second magnetic members have a distance S1 between them along the first electron beam, the second and fourth magnetic members have a distance S2 between them along the first electron beam, and the first and third magnetic members have a distance S3 between them along the second electron beam, so that the distances may satisfy a relational expression of S1+S2=S3.

19. The combined illumination lens as set forth in claim 15, wherein:
the first and fourth magnetic members have the second openings in plural numbers, the third magnetic member is arranged for each of the second openings that transmit the second electron beam, and the distance between the first magnetic member and each third magnetic member along the second electron beam is S3.

20. The combined illuminatign lens as set forth in claim 16, wherein:
the diameter of the opening of the second magnetic member along the first electron beam decreases toward the downstream side.

21. A combined illumination lens receiving first and second electron beams that are parallel to each other and are separated by a predetermined distance, comprising:
a first magnetic member provided with a first opening transmitting the first electron beam; and
a second magnetic member provided with a second opening transmitting the second electron beam,
the first and second magnetic members having the same configuration and being displaced from each other by a predetermined distance along the first and second electron beams to make the first electron beam into a parallel wave and the second electron beam into a converging wave.

22. The combined illumination lens as set forth in claim 21, further comprising:
a partition member arranged between the first and second electron beams, to prevent these electron beams from intersecting each other.

23. The combined illumination lens as set forth in claim 22, further comprising:
an astigmatism correction means arranged before and after the combined illumination lens, to correct astigmatism produced by the combined illumination lens.

* * * * *